US010989770B2

(12) United States Patent
He et al.

(10) Patent No.: US 10,989,770 B2
(45) Date of Patent: Apr. 27, 2021

(54) WIDE MAGNETIC FIELD RANGE MEASURING METHOD AND DEVICE

(71) Applicants: TSINGHUA UNIVERSITY, Beijing (CN); SICHUAN ENERGY INTERNET RESEARCH INSTITUTE, TSINGHUA UNIVERSITY, Sichuan (CN)

(72) Inventors: Jinliang He, Beijing (CN); Yong Ouyang, Sichuan (CN); Jun Hu, Beijing (CN); Shanxiang Wang, Beijing (CN); Gen Zhao, Beijing (CN); Zhongxu Wang, Beijing (CN); Rong Zeng, Beijing (CN); Chijie Zhuang, Beijing (CN); Bo Zhang, Beijing (CN); Zhanqing Yu, Beijing (CN)

(73) Assignees: TSINGHUA UNIVERSITY, Beijing (CN); SICHUAN ENERGY INTERNET RESEARCH INSTITUTE, TSINGHUA UNIVERSITY, Sichuan (CN)

(*) Notice: Subject to any disclaimer, the term of this patent is extended or adjusted under 35 U.S.C. 154(b) by 177 days.

(21) Appl. No.: 16/462,395

(22) PCT Filed: Jun. 28, 2017

(86) PCT No.: PCT/CN2017/090548
§ 371 (c)(1),
(2) Date: May 20, 2019

(87) PCT Pub. No.: WO2018/090636
PCT Pub. Date: May 24, 2018

(65) Prior Publication Data
US 2019/0339342 A1  Nov. 7, 2019

(30) Foreign Application Priority Data
Nov. 18, 2016  (CN) .......................... 201611022569.3

(51) Int. Cl.
*G01R 33/09*  (2006.01)
(52) U.S. Cl.
CPC .................. *G01R 33/093* (2013.01)
(58) Field of Classification Search
None
See application file for complete search history.

(56) References Cited

U.S. PATENT DOCUMENTS 5,945,825 A * 8/1999 Clemens .............. G01R 33/093
                                                324/252
8,466,676 B2 * 6/2013 Saruki ................ G01R 33/0029
                                                324/252
(Continued)

FOREIGN PATENT DOCUMENTS

CN        101044412 A      9/2007
CN        202351418 U      7/2012
(Continued)

*Primary Examiner* — William J Klimowicz
(74) *Attorney, Agent, or Firm* — Novick, Kim & Lee, PLLC; Allen Xue

(57) ABSTRACT

A wide magnetic field range measuring method includes the measurement step for a medium-and-large magnetic field and the measurement step for an extremely large magnetic field. In addition to that, the method further includes: Step 1: placing four orthogonally-configured magnetic resistance resistors into an external magnetic field and obtaining the resistance value of each magnetic resistance resistor; Step 2: substituting the resistance values of two mutually orthogonal magnetic resistance resistors into the measurement step for a medium-and-large magnetic field for calculation; if calculation process converges, then, determining that the external magnetic field as a medium-and-large magnetic field with the calculation result representing the magnetic field intensity and the direction of the medium-and-large magnetic field.

8 Claims, 7 Drawing Sheets

(56) References Cited

U.S. PATENT DOCUMENTS

2006/0261802 A1* 11/2006 Oohashi ................ G06F 3/0338
                                                          324/207.21
2014/0266185 A1    9/2014 Sidman

FOREIGN PATENT DOCUMENTS

| CN | 102707246 A | 10/2012 |
| CN | 104076302 A | 10/2014 |
| TW | 201038957 A | 11/2010 |

* cited by examiner

WIDE MAGNETIC FIELD RANGE MEASURING METHOD AND DEVICE

TECHNICAL FIELD

The disclosure relates to the technical field of magnetic field measurement, and more particularly, to a measuring method for the magnetic field intensity of a small range, a medium-and-large range and an extremely large range.

BACKGROUND

If the magnetic field to be measured is small (the magnetic field intensity is less than $0.1H_{AF}$, $H_{AF}$ is the anisotropy field of the free layer of the magnetic resistance resistor, and different magnetic resistance resistors are varied in $H_{AF}$, the $H_{AF}$ is generally tens of $O_e$. $O_e$ is the magnetic field strength unit, Oersted), a magnetic resistance resistor features good linearity and better measuring accuracy.

It is considered that, for the existing small magnetic field measuring method, the sensitivity is the highest in the hard axis direction of the magnetic resistance resistor (that is, the angle between the magnetic field direction and the easy axis direction is 90°). When the magnitude and direction of the magnetic field are calculated according to the resistance value of the magnetic resistance resistor, calculation is executed by taking this direction as the maximum sensitivity direction.

However, the study shows that the angle between the maximum sensitivity direction of the magnetic resistance resistor and the magnetic field is not 90°, which may be possibly offset by an angle. Therefore, the existing calculating model cannot measure small magnetic fields more accurately. A new measuring method of a small magnetic field needs to be provided based on our research findings.

Furthermore, the existing magnetic resistance resistor measuring model is difficult to measure a medium-and-large magnetic field (with the magnetic field intensity of about 4 to 6 $H_{AF}$) because: 1) the magnetic resistance resistor sensing curve tends to be saturated from a linear relationship in a medium-and-large range, which is severely non-linear. It is necessary to establish a non-linear model for calculation; 2) the reference layer of the magnetic resistance resistor will rotate significantly. The influence of the reference layer must be considered; 3) it is possible that the magnetic resistance domain direction is irreversibly overturned. As a result, resistance value jump occurs, and two different branched sensing curves are formed.

If the external magnetic field is extremely large, the domain of the magnetic resistance reference layer will significantly rotate and the magnetic resistance resistor will enter the saturation region.

Therefore, the existing measuring method cannot accommodate the measurement of a large magnetic field range (with a magnetic field range of about 1 $mO_e$ to 2.5 $kO_e$). It is necessary to bring forward a new measuring method of a large magnetic field.

SUMMARY

The present disclosure provides a measuring method for a large magnetic field, including the measurement step for a small magnet field, the measurement step for a medium-and-large magnetic field and the measurement step for an extremely large magnetic field, in addition to that, further comprising steps of:

Step 1: placing four orthogonally-configured magnetic resistance resistors into an external magnetic field and obtaining the resistance value of each magnetic resistance resistor, wherein the first magnetic resistance resistor and the third magnetic resistance resistor are placed on one straight line, the second magnetic resistance resistor and the fourth magnetic resistance resistor are placed on the other straight line, and the two straight lines are perpendicular to each other; and Step 2: if resistance value variation quantities of the detected four resistance values of the four magnetic resistance resistors are less than set values with respect to a zero magnetic field, measuring the external magnetic field by the measurement step for a small magnetic field; if all the detected four resistance values of the four magnetic resistance resistors are reduced, measuring the external magnetic field by the measurement step for an extremely large magnetic field.

If none of the four resistance values of the four magnetic resistance resistors can meet the two above-mentioned judging conditions, substituting the resistance values of two mutually orthogonal magnetic resistance resistors into the measurement step for a medium-and-large magnetic field for calculation; if the calculation process converges, then determining that the external magnetic field as a medium-and-large magnetic field with the calculation result representing the magnetic field intensity and the direction of a medium-and-large magnetic field; and if the calculation process does not converge, then substituting the resistance values of the four magnetic resistance resistors in the measurement step for an extremely large magnetic field for calculation and determining that the external magnetic field is an extremely large magnetic field with the calculation result representing the magnetic field intensity and direction of the extremely large magnetic field Wherein, the measurement step of a medium-and-large magnetic field further includes:

Step M1: obtaining the resistance values of two orthogonal magnetic resistance resistors in the external magnetic field, and considering initial reference layer magnetizing directions of these two magnetic resistance resistors without a magnetic field as given reference layer magnetizing directions $\varphi_{R1}$, $\varphi_{R2}$;

Step M2: calculating included angles between free layer magnetizing directions and the reference layer magnetizing directions of the two magnetic resistance resistors according to the resistance values of the two magnetic resistance resistors;

Step M3: calculating the free layer magnetizing directions of the two magnetic resistance resistors according to the given reference layer magnetizing directions $\varphi_{R1}$, $\varphi_{R2}$ of the magnetic resistance resistors and the included angles between the free layer magnetizing directions and the reference layer magnetizing directions of the two magnetic resistance resistors;

Step M4: obtaining the magnetic field amplitude and direction of the external magnetic field according to the given reference layer magnetizing directions of the two magnetic resistance resistors and the free layer magnetizing directions of the two magnetic resistance resistors; and Step M5: comparing the magnetic field amplitude and direction of the external magnetic field calculated for this time with a previously calculated result, if a difference of the two calculated results is greater than a set threshold, updating the reference layer magnetizing directions of the two magnetic resistance resistors according to the magnetic field amplitude and direction of the external magnetic field calculated for this time, and considering the updated reference layer magnetizing directions as new given reference layer magnetizing directions $\varphi_{R1}, \varphi_{R2}$, executing the Steps M2 to M5 until the difference of the two calculated results is less than the set threshold.

The measurement step of an extremely large magnetic field further includes:

Step N1: calculating the included angles between the free layer magnetizing directions and the reference layer magnetizing directions of the four magnetic resistance resistors according to the resistance values of the four magnetic resistance resistors;

Step N2: calculating the magnetic field intensity $H_1$ and direction $\theta_1$ of the external magnetic field according to the included angle between the free layer magnetizing direction and the reference layer magnetizing direction of the first magnetic resistance resistor and the included angle between the free layer magnetizing direction and the reference layer magnetizing direction of the third magnetic resistance resistor, and calculating the magnetic field intensity $H_2$ and direction $\theta_2$ of the external magnetic field according to the included angle between the free layer magnetizing direction and the reference layer magnetizing direction of the second magnetic resistance resistor and the included angle between the free layer magnetizing direction and the reference layer magnetizing direction of the fourth magnetic resistance resistor; and Step N3: determining the final magnetic field intensity $H_0$ of the external magnetic field according to the magnetic field intensities $H_1$ and $H_2$, and determining the final direction $\theta$ of the external magnetic field according to the directions $\theta_2$ and $\theta_1$.

The measurement step of a small magnetic field further includes:

Step S1: acquiring the resistances $R_1$ and $R_2$ of two orthogonal magnetic resistance resistors in a magnetic field to be measured;

Step S2: substituting the resistance $R_1$ of one magnetic resistance resistor and its intrinsic parameters into the formula $R=k_m \cos(\theta-\theta_0)H_0+R_0$, and substituting the resistance $R_2$ of the other magnetic resistance resistor and its intrinsic parameters into the formula $R=k_m \cos(\theta-\theta_0-\theta')H_0+R_0$ to obtain binary equations:

Wherein, R is the resistance of the magnetic resistance resistor placed into the magnetic field to be measured; $H_0$ is the magnetic field intensity of the magnetic field to be measured; $\theta$ is the direction of the magnetic field to be measured; and $R_0$ is the resistance of the magnetic resistance resistor in case of a zero magnetic field;

$$k_m = \sin(\varphi_{F0} - \varphi_{R0})\sqrt{A^2 + B^2 - 2AB\cos(\varphi_{F0} - \varphi_{R0})};$$

$$\theta_0 = \frac{\pi}{2} - \arctan\frac{B\sin\varphi_{R0} - A\sin\varphi_{F0}}{A\cos\varphi_{F0} - B\cos\varphi_{R0}};$$

wherein, $\varphi_{F0}$ is the free layer saturation-magnetization direction and $\varphi_{R0}$ is the reference layer saturation-magnetization direction when the magnetic resistance resistor is placed in the zero magnetic field;

$$A = \frac{1}{H_{AF}} \frac{1}{h_{BF}\cos\theta_{BF}\sec\varphi_{F0} + \cos^2\varphi_{F0}},$$

$$B = \frac{1}{H_{AR}} \frac{\sin(\theta - \varphi_{R0})}{h_{BR}\cos\theta_{BR}\sec\varphi_{R0} + \cos^2\varphi_{R0}};$$

wherein, $H_{AF}$ is the anisotropy field amplitude of the free layer of the magnetic resistance resistor and $H_{AR}$ is the anisotropy field amplitude of the reference layer of the magnetic resistance resistor; $h_{BF}=H_{BF}/H_{AF}$, $H_{BF}$ and $\theta_{BF}$ are respectively the amplitude and direction of the internal bias magnetic field of the free layer of the magnetic resistance resistor; $h_{BR}=H_{BR}/H_{AR}$.

$H_{BR}$ and $\theta_{BR}$ are respectively the amplitude and direction of the internal bias magnetic field of the reference layer of the magnetic resistance resistor; and Step S3: solving the binary equations in Step 2 to obtain the magnetic field intensity $H_0$ and direction $\theta$ of the magnetic field to be measured.

Further, after Steps M2 to M5 are executed repetitively for the set times, if the difference between the result obtained for this time and that obtained previously is still not less than a set value, it is considered that the calculation process of the measurement step for a medium-and-large magnetic field dose not converge.

Further, the measurement step for an extremely large magnetic field also includes Steps N4: optimizing the magnetic field intensity $H_0$ according to the direction $\theta$.

The present disclosure provides a measuring device for a large magnetic field, including a measurement module for a small magnetic field, a measurement module for a medium-and-large magnetic field and a measurement module for an extremely large magnetic field, and further comprising:

A magnetic resistance resistor resistance value obtaining module, which is used to obtain the resistance values of four orthogonally-configured magnetic resistance resistors in the external magnetic field, wherein the first magnetic resistance resistor and the third magnetic resistance resistor are placed on one straight line, the second magnetic resistance resistor and the fourth magnetic resistance resistor are placed on the other straight line, and the two straight lines are perpendicular to each other;

A magnetic field calculating module, which is used to determine as follows: if resistance value variation quantities of the detected four resistance values of the four magnetic resistance resistors are less than set values with respect to a zero magnetic field, measuring the external magnetic field with the small magnetic field measurement module; if the detected four resistance values of the four magnetic resistance resistors are reduced, measuring the external magnetic field with the extremely large magnetic field measurement module;

If none of the four resistance values of the four magnetic resistance resistors can meet the two above-mentioned judging conditions, substituting the resistance values of two mutually orthogonal magnetic resistance resistors into the medium-and-large magnetic field measurement module for calculation; if the calculation process converges, then determining that the external magnetic field as a medium-and-large magnetic field with the calculation result representing the magnetic field intensity and the direction of a medium-and-large magnetic field; and if the calculation process does not converge, then substituting the resistance values of the four magnetic resistance resistors in the extremely large magnetic field measurement module for calculation and determining that the external magnetic field is an extremely large magnetic field with the calculation result representing the magnetic field intensity and direction of the extremely large magnetic field.

Wherein, the measurement module of a medium-and-large magnetic field further includes:

An initialization submodule, which is used to obtain the resistance values of two orthogonal magnetic resistance resistors in the external magnetic field, and consider the initial reference layer magnetizing directions of these two magnetic resistance resistors without a magnetic field as the given reference layer magnetizing directions $\varphi_{R1}$, $\varphi_{R2}$;

A calculation submodule of the included angle between the free layer and the reference layer, which is used to respectively calculate the included angles between the free layer magnetizing directions and the reference layer magnetizing directions of two magnetic resistance resistors according to the resistance values of the two magnetic resistance resistors;

A calculation submodule of the free layer magnetizing direction, which is used to respectively calculate the free layer magnetizing directions of two magnetic resistance resistors according to the given reference layer magnetizing directions $\varphi_{R1}$, $\varphi_{R2}$ of two magnetic resistance resistors and the included angles between the free layer magnetizing directions and the reference layer magnetizing directions of two resistance resistors;

A calculation submodule of the external magnetic field, which is used to obtain the magnetic field amplitude and direction of the external magnetic field according to the given reference layer magnetizing directions of two magnetic resistance resistors and the free layer magnetizing directions of two magnetic resistance resistors; and A submodule of accuracy determination, which is used to compare the magnetic field amplitude and direction of the external magnetic field calculated for this time with a previously calculated result, if a difference of the two calculated results is greater than a set threshold, update the reference layer magnetizing directions of the two magnetic resistance resistors according to the magnetic field amplitude and direction of the external magnetic field calculated for this time, and consider the updated reference layer magnetizing directions as new given reference layer magnetizing directions $\varphi_{R1}$, $\varphi_{R2}$, and the calculation submodule of the included angle between the free layer and the reference layer, the calculation submodule of the free layer magnetizing direction, the calculation submodule of the external magnetic field, and the submodule of accuracy determination are executed again until the difference of the two calculated results is less than the set threshold.

The measurement module of an extremely large magnetic field further comprises:

A calculation submodule of the included angle between the free layer magnetizing direction and the reference layer magnetizing direction of the magnetic resistance resistor, which is used to calculate the included angle between the free layer magnetizing direction and the reference layer magnetizing direction of each magnetic resistance resistor according to the resistance values of the four magnetic resistance resistors;

A pre-calculation submodule of the magnetic field intensity and direction of the external magnetic field, which is used to calculate the magnetic field intensity $H_1$ and direction $\theta_1$ of the external magnetic field according to the included angle between the free layer magnetizing direction and the reference layer magnetizing direction of the first magnetic resistance resistor and the included angle between the free layer magnetizing direction and the reference layer magnetizing direction of the third magnetic resistance resistor, and calculate the magnetic field intensity $H_2$ and direction $\theta_2$ of the external magnetic field according to the included angle between the free layer magnetizing direction and the reference layer magnetizing direction of the second magnetic resistance resistor and the included angle between the free layer magnetizing direction and the reference layer magnetizing direction of the fourth magnetic resistance resistor; and A determination submodule of the magnetic field intensity and direction of the external magnetic field, which is used to determine the final magnetic field intensity $H_0$ of the external magnetic field according to the magnetic field intensities $H_1$ and $H_2$, and determine the final direction $\theta$ of the external magnetic field according to the directions $\theta_2$ and $\theta_1$.

The measurement module of a small magnetic field further comprises:

An acquisition submodule of the resistance value of the magnetic resistance resistor, which is used to acquire the resistance values $R_1$ and $R_2$ of two orthogonal magnetic resistance resistors in the magnetic field to be measured, wherein the two magnetic resistance resistors are placed in an included angle $\theta'$;

An establishing submodule of equations of a small magnetic field, which is used to substitute the resistance $R_1$ of one magnetic resistance resistor and its intrinsic parameters into the formula $R=k_m \cos(\theta-\theta_0)H_0+R_0$, substitute the resistance $R_2$ of the other magnetic resistance resistor and its intrinsic parameters into the formula $R=k_m \cos(\theta-\theta_0-\theta')H_0+R_0$ to obtain the binary equations:

Wherein, R is the resistance of the magnetic resistance resistor placed into the magnetic field to be measured; $H_0$ is the magnetic field intensity of the magnetic field to be measured; $\theta$ is the direction of the magnetic field to be measured; and $R_0$ is the resistance of the magnetic resistance resistor in case of a zero magnetic field;

$$k_m = \sin(\varphi_{F0} - \varphi_{R0})\sqrt{A^2 + B^2 - 2AB\cos(\varphi_{F0} - \varphi_{R0})};$$

$$\theta_0 = \frac{\pi}{2} - \arctan\frac{B\sin\varphi_{R0} - A\sin\varphi_{F0}}{A\cos\varphi_{F0} - B\cos\varphi_{R0}};$$

wherein, $\varphi_{F0}$ is the free layer saturation-magnetization direction and $\varphi_{R0}$ is the reference layer saturation-magnetization direction, when the magnetic resistance resistor is placed in the zero magnetic field;

$$A = \frac{1}{H_{AF}} \frac{1}{h_{BF}\cos\theta_{BF}\sec\varphi_{F0} + \cos^2\varphi_{F0}},$$

$$B = \frac{1}{H_{AR}} \frac{\sin(\theta - \varphi_{R0})}{h_{BR}\cos\theta_{BR}\sec\varphi_{R0} + \cos^2\varphi_{R0}};$$

wherein, $H_{AF}$ is the anisotropy field amplitude of the free layer of the magnetic resistance resistor and $H_{AR}$ is the anisotropy field amplitude of the reference layer of the magnetic resistance resistor; $h_{BR}=H_{BF}/H_{AF}$, $H_{BF}$. $H_{BF}$ and $\theta_{BF}$ are respectively the amplitude and direction of the internal bias magnetic field of the free layer of the magnetic resistance resistor; $h_{BR}=H_{BR}/H_{AR}$.

$H_{BR}$ and $\theta_{BR}$ are respectively the amplitude and direction of the internal bias magnetic field of the reference layer of the magnetic resistance resistor; and A solving submodule of measurement equations of a small magnetic field, which is used to solve the binary equations to obtain the magnetic field intensity $H_0$ and direction θ of the magnetic field to be measured.

Further, after the calculation submodule of the included angle between the free layer and the reference layer, the calculation submodule of the free layer magnetizing direction, the calculation submodule of the external magnetic field, and the submodule of accuracy determination are executed repetitively for the set times, if the difference between the result obtained for this time and that obtained previously is still not less than a set value, it is considered that the calculation process of the medium-and-large magnetic field measurement module dose not converge.

Further, the extremely large magnetic field measurement module also includes an optimization submodule of magnetic field intensity, which is used to optimize the magnetic field intensity $H_0$ according to the direction θ.

Therefore, due to the adoption of the technical scheme, the present disclosure has the following beneficial effects:

The measuring method for a large magnetic field provided by the present disclosure ensures accurate measurement of the large magnetic field, the measuring range is extended to 2 $mO_e$~2500 $O_e$ and the dynamic range is up to 6 orders of magnitude, especially the maximum field which can be measured by the method is extended from conventional tens of Oersteds to thousands of Oersteds, by 40 times approximately.

BRIEF DESCRIPTION OF THE DRAWINGS

The present disclosure is embodied by various embodiments and with reference to accompanying drawings, wherein.

DETAILED DESCRIPTION OF THE EMBODIMENTS

All the characteristics disclosed herein or all the methods or the steps of processes disclosed may be combined in any way, except those characteristics and/or steps repelled each other.

Unless otherwise narrated, any characteristic disclosed herein may be substituted by other equivalent or similar alternative characteristics. Namely, unless otherwise narrated, each characteristic is only an example of a series of equivalent or similar characteristics.

First, four orthogonally configured magnetic resistance resistors (hereinafter referred to as "resistors" are placed into an external magnetic field. See FIG. 1 for their arrangement, wherein, the resistors R1 and R3 are placed on one straight line and the resistors R2 and R4 are placed on the other straight line. These two straight lines are orthogonal.

Figure 2:
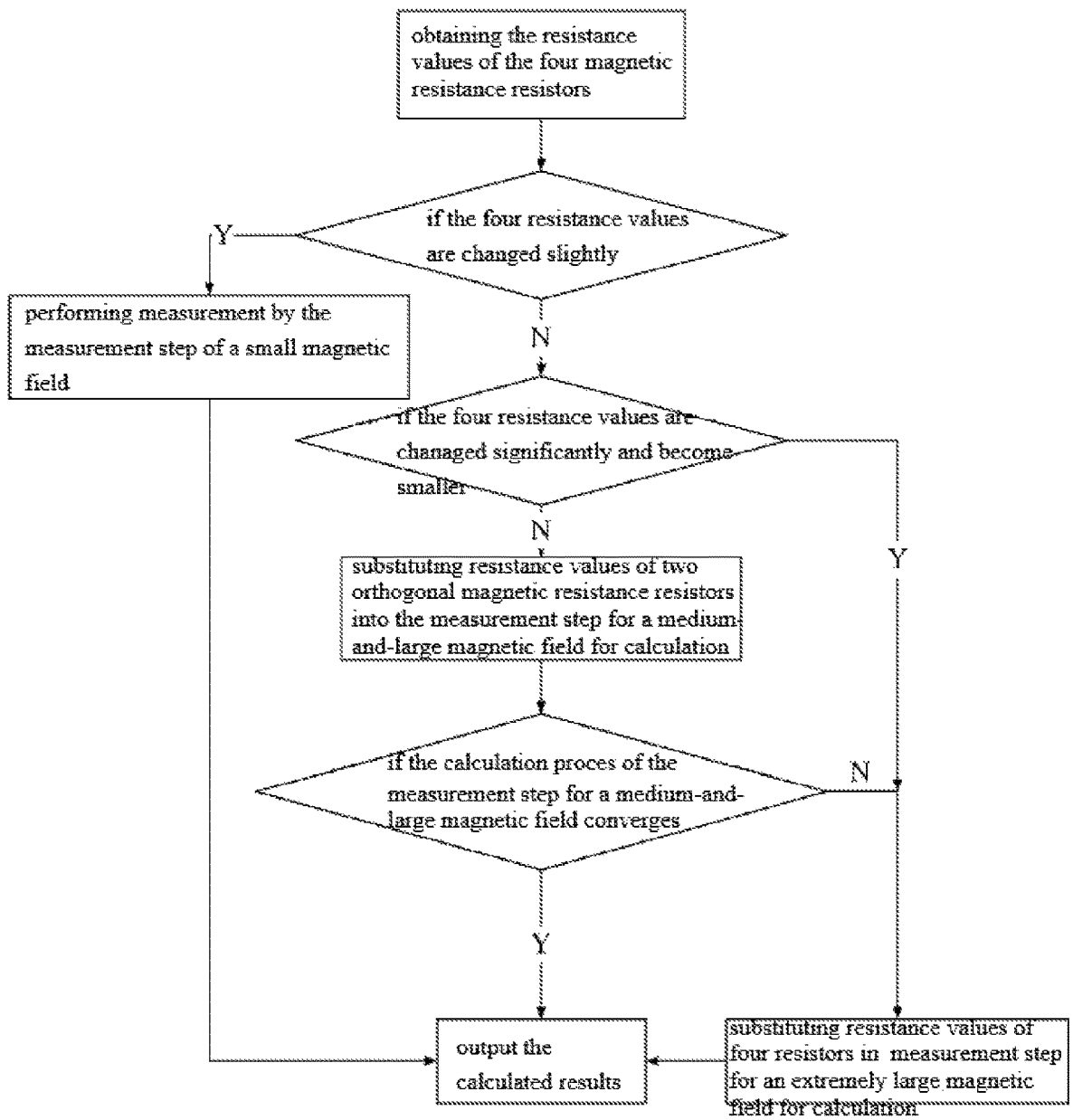
FIG. 2 is the flow chart of the present disclosure.

As shown in FIG. 2, the present disclosure provides a measuring method for a large magnetic field, comprising:

Step 1: obtaining the resistance values of the four magnetic resistance resistors.

Step 2: if resistance value variation quantities of the detected four resistance values of the four magnetic resistance resistors are less than set values (adjustable according to different requirements on technical precision, e.g. 2 to 5 percent) with respect to a zero magnetic field, considering that the external magnetic field is small, and measuring the external magnetic field by the measurement module for a small magnetic field; if all the detected four resistance values of the four magnetic resistance resistors are reduced, measuring the external magnetic field by the measurement module for an extremely large magnetic field.

If none of the four resistance values of the four magnetic resistance resistors can meet the two above-mentioned judging conditions, substituting the resistance values (e.g. R1 and R2 or R3 or R4) of two mutually orthogonal magnetic resistance resistors into the measurement step for a medium-and-large magnetic field for calculation; if the calculation process converges, then determining that the external magnetic field as a medium-and-large magnetic field with the calculation result representing the magnetic field intensity and the direction of a medium-and-large magnetic field; and if the calculation process does not converge, then substituting the resistance values of the four magnetic resistance resistors in the measurement step for an extremely large magnetic field for calculation and determining that the external magnetic field is an extremely large magnetic field with the calculation result representing the magnetic field intensity and direction of the extremely large magnetic field.

The measurement step for a small magnetic field, the measurement step for a medium-and-large magnetic field and the measurement step for an extremely large magnetic field are described as follows:

The Measurement Step of a Small Magnetic Field

A small magnetic field may be measured with existing measuring technologies. For higher measurement precision, the following steps are executed in a preferable embodiment of the present disclosure.

Measuring the resistance values $R_1$ and $R_2$ of two orthogonal magnetic resistance resistors in the small magnetic field to be measured. Of course, $R_3$ and $R_4$ may be obtained for calculation. In this embodiment, the calculation is carried out with resistance values $R_1$ and $R_2$.

Substituting the resistance $R_1$ of one magnetic resistance resistor and its intrinsic parameters into the formula $R=k_m \cos(\theta-\theta_0)H_0+R_0$, and substituting the resistance $R_2$ of the other magnetic resistance resistor and its intrinsic parameters into the formula $R=k_m \cos(\theta-\theta_0-\theta')H_0+R_0$ to obtain binary equations.

Wherein, R is the resistance of the magnetic resistance resistor placed into the magnetic field to be measured; $H_0$ is the magnetic field intensity of the magnetic field to be measured; θ is the direction of the magnetic field to be measured; and $R_0$ is the resistance of the magnetic resistance resistor in case of a zero magnetic field;

$$k_m = \sin(\varphi_{F0} - \varphi_{R0})\sqrt{A^2 + B^2 - 2AB\cos(\varphi_{F0} - \varphi_{R0})};$$

$$\theta_0 = \frac{\pi}{2} - \arctan\frac{B\sin\varphi_{R0} - A\sin\varphi_{F0}}{A\cos\varphi_{F0} - B\cos\varphi_{R0}};$$

wherein, $\varphi_{F0}$ is the free layer saturation-magnetization direction and $\varphi_{R0}$ is the reference layer saturation-magnetization direction, when the magnetic resistance resistor is placed in the zero magnetic field;

$$A = \frac{1}{H_{AF}} \frac{1}{h_{BF}\cos\theta_{BF}\sec\varphi_{F0} + \cos^2\varphi_{F0}},$$

$$B = \frac{1}{H_{AR}} \frac{\sin(\theta - \varphi_{R0})}{h_{BR}\cos\theta_{BR}\sec\varphi_{R0} + \cos^2\varphi_{R0}};$$

wherein, $H_{AF}$ is the anisotropy field amplitude of the free layer of the magnetic resistance resistor and $H_{AR}$ is the anisotropy field amplitude of the reference layer of the magnetic resistance resistor; $h_{BF}=H_{BF}/H_{AF}$, $H_{BF}$ and $\theta_{BF}$ are respectively the amplitude and direction of the internal bias magnetic field of the free layer of the magnetic resistance resistor; $h_{BR}=H_{BR}/H_{AR}$, $H_{BR}$ and $\theta_{BR}$ are respectively the amplitude and direction of the internal bias magnetic field of the reference layer of the magnetic resistance resistor.

The two equations finally obtained are:

$R_1 = k_{m1}\cos(\theta-\theta_{01})H_0 + R_{01}$; $R_2 = k_{m2}\cos(\theta-\theta_{02}-\theta')H_0 + R_{02}$;

wherein, $R_{01}$ is the resistance value of the first magnetic resistance resistor in case of the zero magnetic field, which may be measured.

$$k_{m1} = \sin(\varphi_{F01} - \varphi_{R01})\sqrt{A_1^2 + B_1^2 - 2A_1B_1\cos(\varphi_{F01} - \varphi_{R02})}$$

$$\theta_{01} = \frac{\pi}{2} - \arctan\frac{B_1\sin\varphi_{R01} - A_1\sin\varphi_{F01}}{A_1\cos\varphi_{F01} - B_1\cos\varphi_{R01}};$$

wherein, $\varphi_{F01}$ is the free layer saturation-magnetization direction and $\varphi_{R01}$ is the reference layer saturation-magnetization direction, when the first magnetic resistance resistor is placed in the zero magnetic field. Both $\varphi_{F01}$ and $\varphi_{R01}$ are may be measured in case of a zero magnetic field.

$$A_1 = \frac{1}{H_{AF1}} \frac{1}{h_{BF1}\cos\theta_{BF1}\sec\varphi_{F01} + \cos^2\varphi_{F01}},$$

$$B_1 = \frac{1}{H_{AR1}} \frac{\sin(\theta - \varphi_{R01})}{h_{BR1}\cos\theta_{BR1}\sec\varphi_{R01} + \cos^2\varphi_{R01}};$$

wherein $H_{AF1}$ is the anisotropy field amplitude of the free layer of the first magnetic resistance resistor and $H_{AR1}$ is the anisotropy field amplitude of the reference layer of the first magnetic resistance resistor; $h_{BF1}=H_{BF1}/H_{AF1}$, $H_{BF1}$ and $\theta_{BF1}$ are respectively the amplitude and direction of the internal bias magnetic field of the free layer of the first magnetic resistance resistor; $h_{BR1}=H_{BR1}/H_{AR1}$, $H_{BR1}$ and $\theta_{BR1}$ are respectively the amplitude and direction of the internal bias magnetic field of the reference layer of the first magnetic resistance resistor. These values are the intrinsic parameters of the magnetic resistance resistor, which may be measured and also can be obtained from the data manual provided by the magnetic resistance resistor manufacturer.

Likewise, $k_{m2}$ and $\theta_{02}$ may be obtained by substituting relevant parameters of the second magnetic resistance.

The magnetic field intensity $H_0$ and direction $\theta$ of the small magnetic field to be measured may be obtained by solving the two equations.

The method disclosed herein is applied to various magnetic resistance resistors including tunneling magnetic resistance resistors, giant magnetic resistance resistors and magnetic resistance resistors with spin valves.

With a tunneling magnetic resistance resistor as an example, the derivation process of the said method is explained as follows so that those skilled in the art may more completely recognize the present disclosure.

Figure 3:
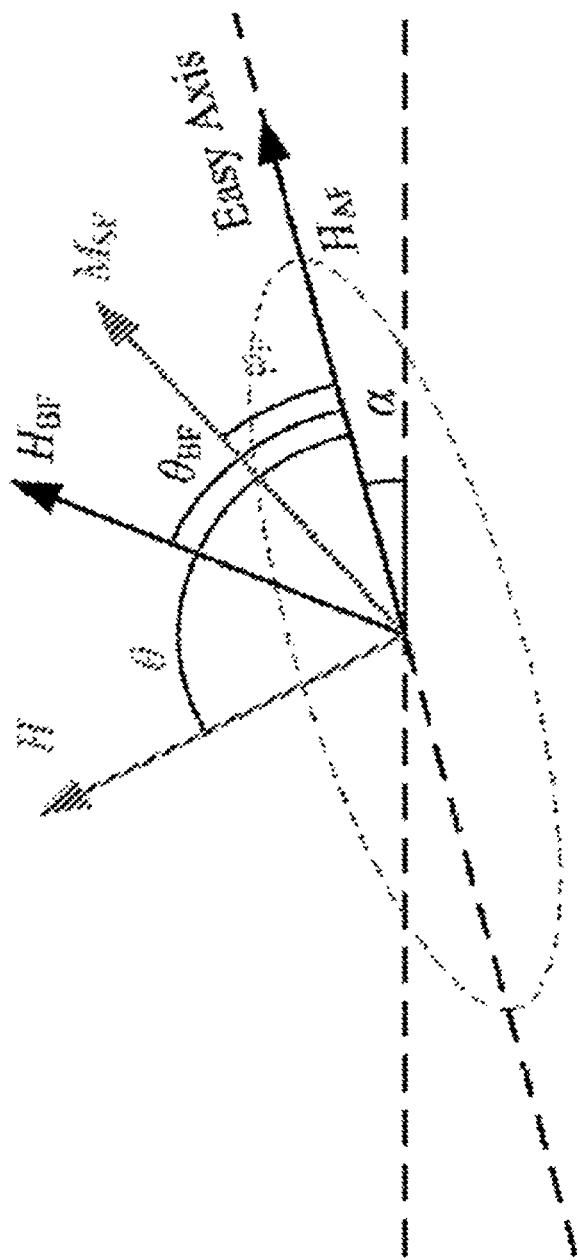
FIG. 3 represents the single-domain model of tunneling magnetic resistance.

For the measurement of a small magnetic field range, the coupling energy between the free layer and the reference layer may be included in the free layer for calculation because the external magnetic field is far less than the internal bias field of the reference layer and the pinned layer and both the pinning layer and reference layer are nearly unchanged. Both the pinning layer and reference layer may be simplified as the simplest model as shown in FIG. 3 and they may be separately calculated. Given the easy axis angle is $\alpha=0$, the magnetizing directions of the free layer and the reference layer are:

$h_F\sin(\varphi_F-\theta)+h_{BF}\sin(\varphi_F-\varphi_{BF})+\sin\varphi_F\cos\varphi_F=0$ $h_R\sin(\varphi_R-\theta)+h_{BR}\sin(\varphi_R-\varphi_{BR})+\sin\varphi_R\cos\varphi_{RF}=0$;

wherein, $h_F=H/H_{AF}$, $h_R=H/H_{AR}$; $\varphi_F$ is the saturation magnetization intensity of the free layer of the tunneling magnetic resistance resistor; $\varphi_R$ is the saturation magnetization intensity of the reference layer of the tunneling magnetic resistance resistor.

Without an external magnetic field, the magnetizing direction of each layer satisfies:

$h_{BF}\sin(\varphi_{F0}-\theta_{BF})+\sin\varphi_{F0}\cos\varphi_{F0}=0$ $h_{BR}\sin(\varphi_{R0}-\theta_{BR})+\sin\varphi_{R0}\cos\varphi_{R0}=0$ wherein, the magnetizing direction of the free layer satisfies:

$$\cos\varphi_F = \frac{(h_{BF}\cos\theta_{BF} + h_F\cos\theta)\sin\varphi_F}{h_{BF}\sin\theta_{BF} + h_F\sin\theta - \sin\varphi_F}$$

if the external magnetic field is unchanged, the magnetizing direction of the free layer satisfies:

$$\frac{d(\cos\varphi_F)}{dh_F} = -\tan\varphi_F \frac{d(\sin\varphi_F)}{dh_F},$$

if the external magnetic field is zero, the derivative satisfies:

$$\left.\frac{d(\sin\varphi_F)}{dh_F}\right|_{h_F=0} = \frac{\sin(\theta - \varphi_{F0})}{h_{BF}\cos\theta_{BF}\sec^2\varphi_{F0} + \cos\varphi_{F0}}$$

accordingly, if the external magnetic field is zero, the derivative of the reference layer satisfies:

$$\left.\frac{d(\sin\varphi_R)}{dh_R}\right|_{h_R=0} = \frac{\sin(\theta - \varphi_{R0})}{h_{BR}\cos\theta_{BR}\sec^2\varphi_{R0} + \cos\varphi_{R0}}$$

Apparently, the sensitivity of the tunneling magnetic resistance resistor includes two components, i.e. the component on the free layer and that on the reference layer. The maximum sensitivity direction of each component is perpendicular to its initial magnetizing direction.

Therefore, if the external magnetic field is zero, the derivative of the tunneling magnetic resistance resistor satisfies:

$$\frac{1}{0.5\Delta_{max}R_{avg}}\frac{dR}{dH}\bigg|_{H=0} = \quad (1)$$

$$\sin(\varphi_{F0} - \varphi_{R0})\left(\frac{1}{H_{AF}}\frac{\sin(\theta - \varphi_{F0})}{h_{BF}\cos\theta_{BF}\sec\varphi_{F0} + \cos^2\varphi_{F0}} - \frac{1}{H_{AR}}\frac{\sin(\theta - \varphi_{R0})}{h_{BR}\cos\theta_{BR}\sec\varphi_{R0} + \cos^2\varphi_{R0}}\right);$$

$$\frac{1}{0.5\Delta_{max}R_{avg}}\frac{dR}{dH}\bigg|_{H=0}$$

the sensitivity of the normalized tunneling magnetic resistance resistor; $R_{avg}=(R_{max}+R_{min})/2$, is the average resistance; $\Delta_{max}=(R_{max}-R_{min})/R_{avg}$, is the maximum magnetic resistance change rate. For the magnetic resistance resistor, if the free layer has the same magnetizing direction as the reference layer, the resistance value will be minimum, expressed by $R_{min}$; if the free layer has a magnetizing direction opposite to that of the reference layer, the resistance value will be maximum, expressed by $R_{max}$.

Figure 4:
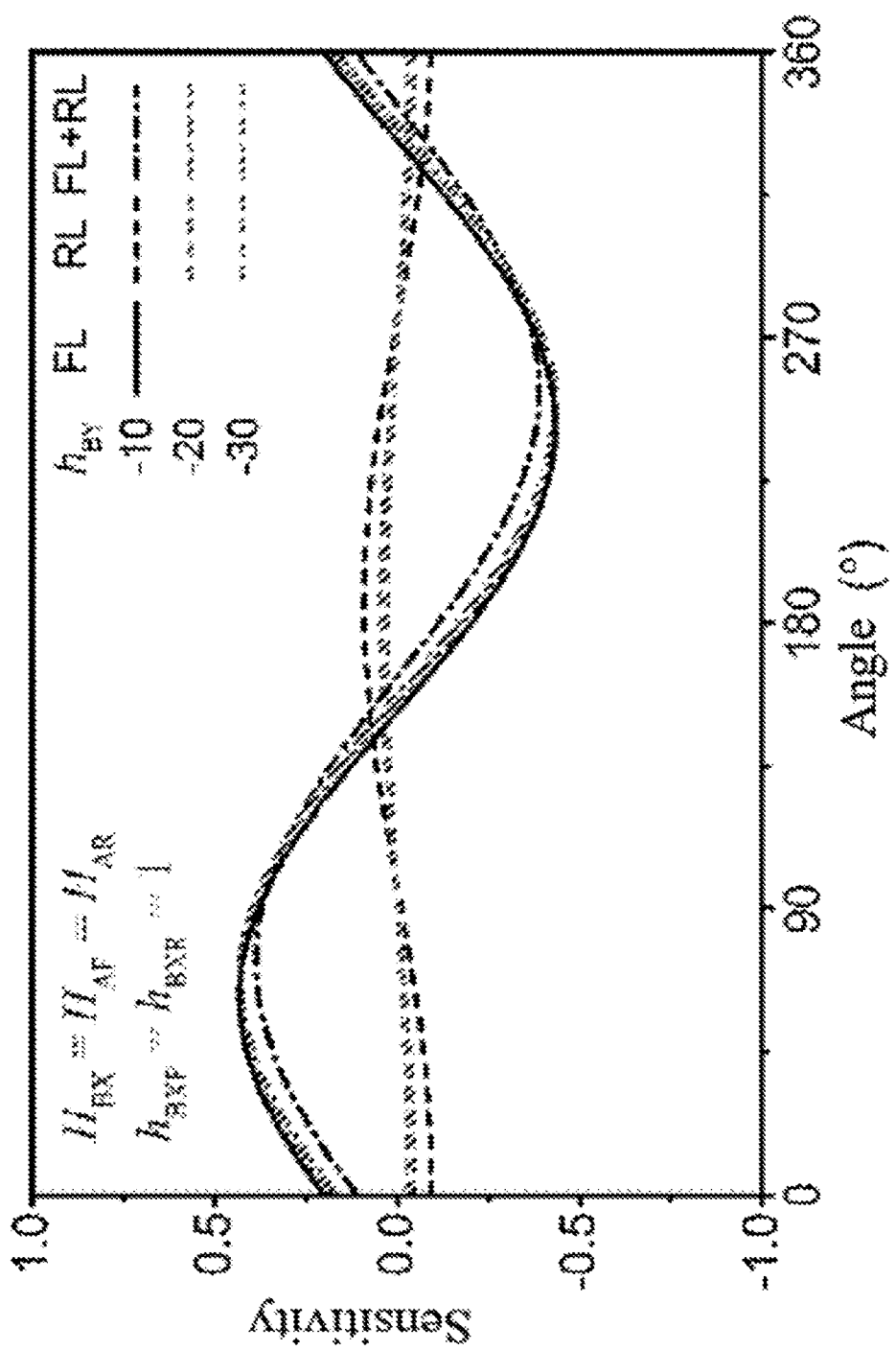
FIG. 4 shows the simulated chart of the sensitivity contributed by the free layer and reference layer of the tunneling magnetic resistance resistor along with the angle under a small magnetic field environment.

The result as shown in FIG. 4 may be obtained by simulating the equation (1). Generally, the reference layer is strongly coupled in the hard axis direction by the pinned layer. As a result, the typical value of the coupling field may be up to thousands of Gausses, which is much higher than the external magnetic field. The magnetizing direction of the reference layer is very slightly varied with the changed external magnetic field. FIG. 3 shows the sensitivity contributed by the free layer and the reference layer of the tunneling magnetic resistance along with the angle, wherein, FL is the sensitivity of the free layer; RL is the sensitivity of the reference layer; and the simulation setting is $h_{BXR}$ ($=H_{BR}\cos(\theta_{BR})$)=$h_{BXR}$ ($=H_{BR}\sin(\theta_{BR})$)=1. The total sensitivity is the superposition of the component of the free layer and that of the reference layer. After superposition, the FL+RL still changes in a sinusoidal way. FIG. 3 shows that the maximum sensitivity direction of the tunneling magnetic resistance resistor is not 90° from the magnetic field direction. However, before 90°, the sine curve has presented its maximum.

Those skilled in the art know that, in a small magnetic field, for a tunneling magnetic resistance resistor, the resistance R is linearly changed with the varied magnetic field intensity, i.e.

$$R = \frac{1}{0.5\Delta_{max}R_{avg}}\frac{dR}{dH_0}\bigg|_{H=0}H_0 + R_0.$$

the equation (1) is deformed. Given:

$$A = \frac{1}{H_{AF}}\frac{1}{h_{BF}\cos\theta_{BF}\sec\varphi_{F0} + \cos^2\varphi_{F0}},$$

$$B = \frac{1}{H_{AR}}\frac{\sin(\theta - \varphi_{R0})}{h_{BR}\cos\theta_{BR}\sec\varphi_{R0} + \cos^2\varphi_{R0}}.$$

the right side of the equation is changed into:

$$\sin(\varphi_{F0} - \varphi_{R0})(A\sin(\theta - \varphi_{F0}) - B\sin(\theta - \varphi_{R0})) = \sin(\varphi_{F0} - \varphi_{R0})$$

$$(A\sin\theta\cos\varphi_{F0} - A\cos\theta\sin\varphi_{F0} - B\sin\theta\cos\varphi_{R0} + B\cos\theta\sin\varphi_{R0}) =$$

$$\sin(\varphi_{F0} - \varphi_{R0})((A\cos\varphi_{F0} - B\cos\varphi_{R0})\sin\theta + (B\sin\varphi_{R0} - A\sin\varphi_{F0})\cos\theta) =$$

$$\sin(\varphi_{F0} - \varphi_{R0})\sqrt{(A\cos\varphi_{F0} - B\cos\varphi_{R0})^2 + (B\sin\varphi_{R0} - A\sin\varphi_{F0})^2}$$

$$\sin\left(\theta + \arctan\frac{B\sin\varphi_{R0} - A\sin\varphi_{F0}}{A\cos\varphi_{F0} - B\cos\varphi_{R0}}\right) =$$

$$\sin(\varphi_{F0} - \varphi_{R0})\sqrt{A^2 + B^2 - 2AB\cos(\varphi_{F0} - \varphi_{R0})}$$

$$\sin\left(\theta + \arctan\frac{B\sin\varphi_{R0} - A\sin\varphi_{F0}}{A\cos\varphi_{F0} - B\cos\varphi_{R0}}\right)$$

the sensitivity amplitude is:

$$k_m = \sin(\varphi_{F0} - \varphi_{R0})\sqrt{A^2 + B^2 - 2AB\cos(\varphi_{F0} - \varphi_{R0})},$$

the sensitivity direction is:

$$\theta_0 = \frac{\pi}{2} - \arctan\frac{B\sin\varphi_{R0} - A\sin\varphi_{F0}}{A\cos\varphi_{F0} - B\cos\varphi_{R0}},$$

the final equation is:

$$\frac{1}{0.5\Delta_{max}R_{avg}}\frac{dR}{dH_0}\bigg|_{H=0} = k_m\cos(\theta - \theta_0).$$

further, the equation $R = k_m \cos(\theta - \theta_0)H_0 + R_0$° is obtained.

The Measurement Step of a Medium-and-Large Magnetic Field

Figure 5:
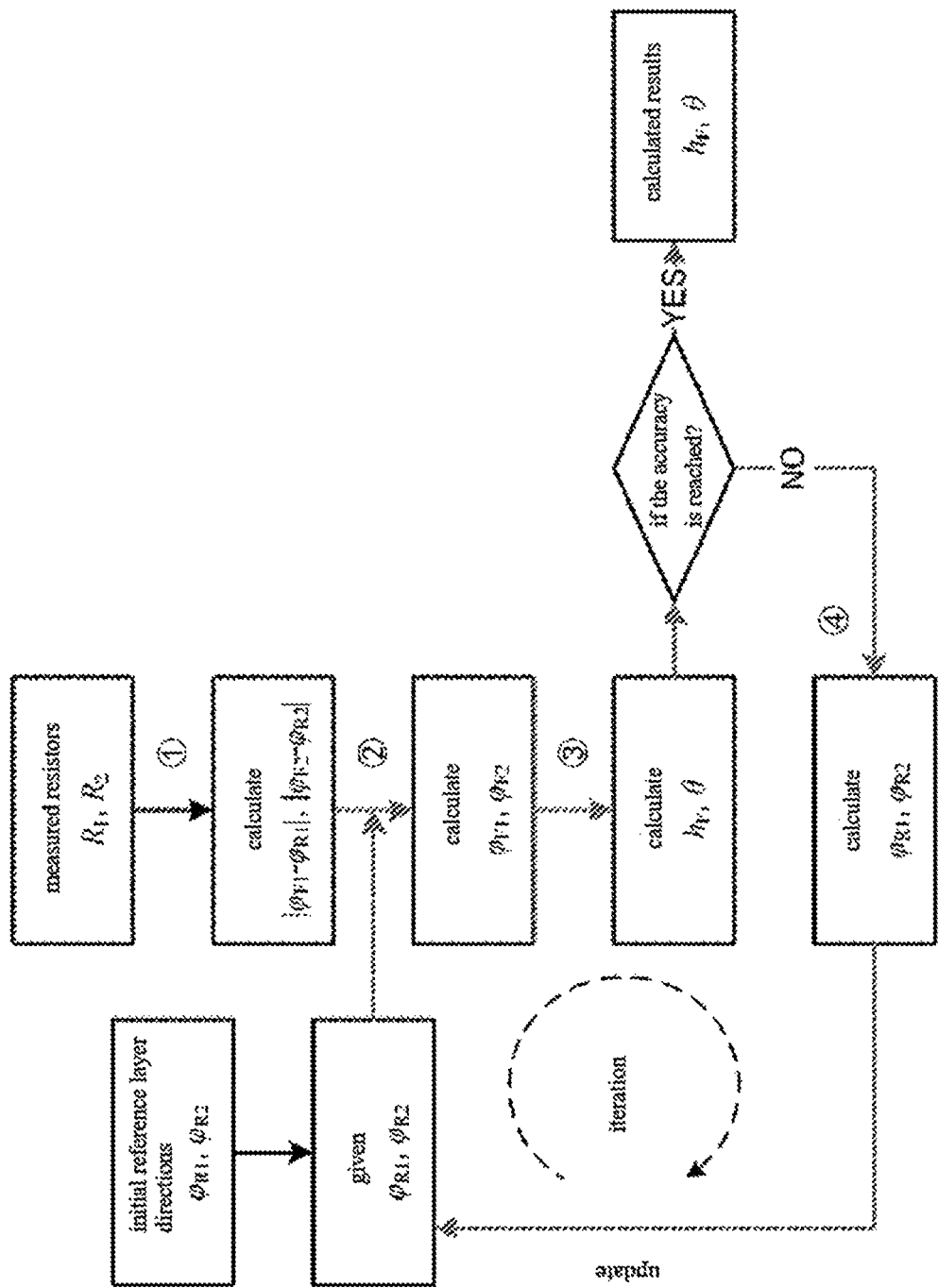
FIG. 5 is the flow chart for the measurement step of a medium-and-large magnetic field.

As shown in FIG. 5, the measurement step of a medium-and-large magnetic field includes:

(1) For any external magnetic field, the magnetic resistance resistors which are different in hard axis direction are measured. In this embodiment, two resistance values of resistors $R_1$ and $R_2$, which are orthogonal to each other, are used, and the initial reference layer magnetizing directions of these two resistors without the magnetic field are considered as given directions $\varphi_{R1}$, $\varphi_{R2}$. It should be noted that the magnetic resistance core typical structure is composed of an anti-ferromagnetic layer (pinning layer)/ferromagnetic layer (pinned layer)/non-magnetic metal/ferromagnetic layer (reference layer)/potential barrier layer/ferromagnetic layer (free layer), and a current perpendicular film face, wherein, induced by a thin layer of non-magnetic metal, the reference layer and the pinned layer form an artificial anti-ferromagnetic structure to ensure that the magnetizing directions of the reference layer and the pinned layer are stable, not easy to destroy by the external magnetic field. The magnetizing direction of the free layer is changed with the varied external magnetic field.

If a magnetic resistance resistor is most easily magnetized along an axis or direction, such axis or direction is called an easy axis. Otherwise, it is called a hard axis.

The resistance value of the magnetic resistance resistor is able to be changed with the varied external magnetic field. Therefore, the external magnetic field may be measured by measuring the resistance value. Two magnetic resistance resistors with different easy axis directions are placed in an external magnetic field, and two resistance values may be obtained by a full-bridge resistance measuring circuit or other resistance measuring circuits.

(2) the included angle between the free layer magnetizing direction and the reference layer magnetizing direction of each magnetic resistance resistor can be calculated according to two resistance values $||\varphi_{F1}-\varphi_{R1}|, |\varphi_{F2}-\varphi_{R2}|$, corresponding to Process ① as shown in FIG. 5, and the calculation formula is:

$$|\varphi_{F1} - \varphi_{R1}| = \arccos\left(\frac{R_{1max} + R_{1min} - 2R_1}{R_{1max} - R_{1min}}\right);$$

wherein, $\varphi_{F1}$ is the free layer magnetizing direction of the first magnetic resistance resistor; $R_{1min}$ is the minimum value of the first magnetic resistance resistor; and $R_{1max}$ is the maximum value of the first magnetic resistance resistor.

$$|\varphi_{F2} - \varphi_{R2}| = \arccos\left(\frac{R_{2max} + R_{2min} - 2R_2}{R_{2max} - R_{2min}}\right).$$

Wherein, $\varphi_{F2}$ is the free layer magnetizing direction of the second magnetic resistance resistor; $R_{2min}$ is the minimum value of the second magnetic resistance resistor; and $R_{2max}$ is the maximum value of the second magnetic resistance resistor.

If the free layer has the same magnetizing direction as the reference layer, the resistance value will be minimum, expressed by $R_{min}$; if the free layer has a magnetizing direction opposite to that of the reference layer, the resistance value will be maximum, expressed by $R_{max}$. $R_{1min}$ is the minimum value of the first magnetic resistance resistor; $R_{1max}$ is the maximum value of the first magnetic resistance resistor; $R_{2min}$ is the minimum value of the second magnetic resistance resistor; and $R_{2max}$ is the maximum value of the second magnetic resistance resistor. These values may be obtained by calibrating two magnetic resistance resistors.

(3) For the given reference layer magnetizing directions, the free layer magnetizing directions $\varphi_{F1}$ and $\varphi_{F2}$, corresponding to Process ② as shown in FIG. 5, are calculated according to the following formula:

$$'\varphi_F = \begin{cases} \varphi_R + |\varphi_F - \varphi_R|, S_1 \\ \varphi_R - |\varphi_F - \varphi_R|, S_2 \end{cases}.$$

The free layer magnetizing direction of the first magnetic resistance resistor, $\varphi_{F1}$, may be obtained by substituting $|\varphi_{F1}-\varphi_{R1}|$ and $\varphi_{R1}$ into the above formula, and, the free layer magnetizing direction of the second magnetic resistance resistor, $\varphi_{F2}$, may be obtained by substituting $|\varphi_{F2}-\varphi_{R2}|$ and $\varphi_{R2}$ into the above formula.

Figure 6:
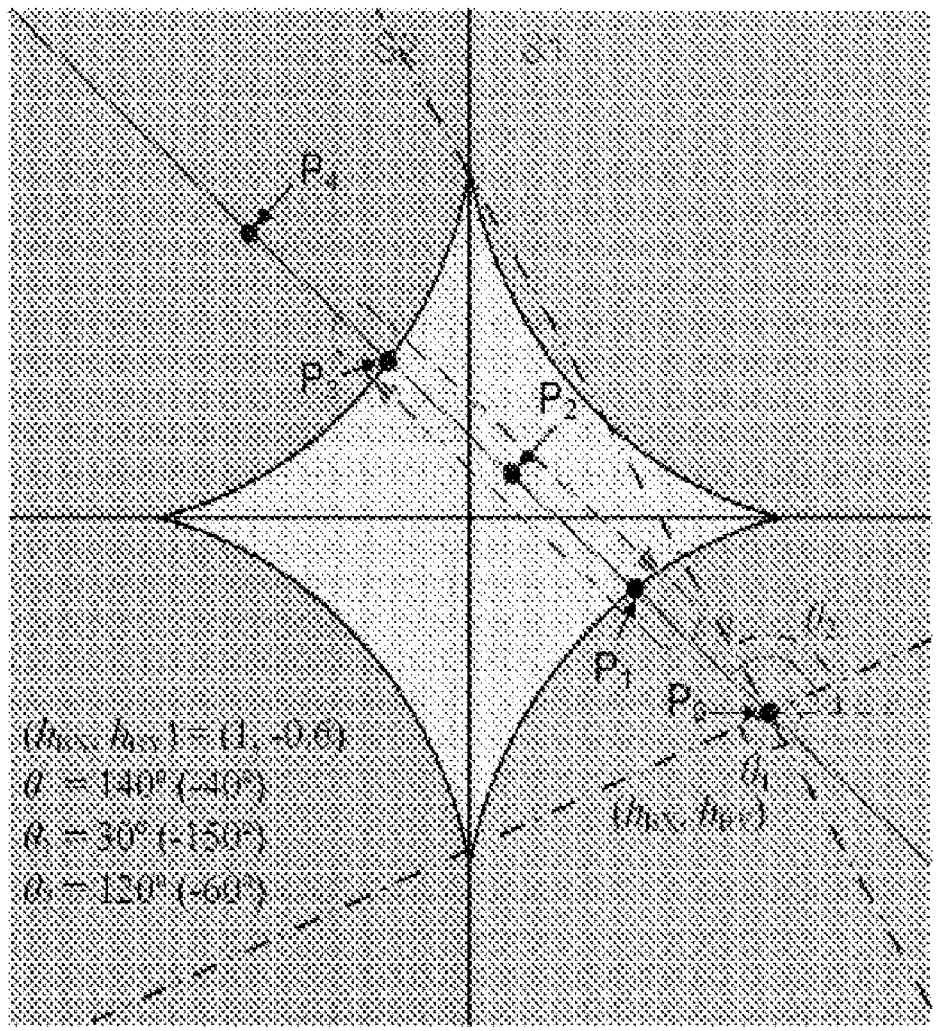
FIG. 6 is the schematic diagram of the normalized star-like curve for the single-domain behavior of the magnetic resistance resistor.

Wherein, S1 and S2 are respectively the easy axis positive direction range $(-\pi/2 \sim \pi/2)$ and easy axis negative direction range $(\pi/2 \sim 3\pi/2)$ of the free layer domain in FIG. 6. For a specific magnetic resistance resistor, the state of the free layer domain is unique.

For a tunneling magnetic resistance resistor, if its free layer internal easy axis bias magnetic field is greater than an anisotropic field, it is ensured that, according to the distribution of four magnetic resistance resistors herein, the free layer domain of at least two orthogonal magnetic resistance resistors of them may be in S1 state. A medium-and-large magnetic field is calculated by selecting two resistors with known states, and both the free layer magnetizing directions $\varphi_{F1}$ and $\varphi_{F2}$ may be determined. The process of producing a tunneling magnetic resistance resistor of which the internal easy axis bias magnetic field is greater than the anisotropic field exists.

(4) According to the calculated free layer magnetizing directions $\varphi_{F1}$ and $\varphi_{F2}$, the amplitude and direction $h_F$ and $\theta$, corresponding to Process ③ as shown in FIG. 5, are calculated according to the following formula:

$$\begin{pmatrix} -\sin(\alpha_1 + \varphi_{F1}) & \cos(\alpha_1 + \varphi_{F1}) \\ -\sin(\alpha_2 + \varphi_{F2}) & \cos(\alpha_2 + \varphi_{F2}) \end{pmatrix} \begin{pmatrix} h_F\cos\theta \\ h_F\sin\theta \end{pmatrix} =$$
$$\begin{pmatrix} h_{BF}\sin(\varphi_{F1} - \theta_{BF}) + \sin\varphi_{F1}\cos\varphi_{F1} - h_1\sin(\varphi_{F1} - \varphi_{R1}) \\ h_{BF}\sin(\varphi_{F2} - \theta_{BF}) + \sin\varphi_{F2}\cos\varphi_{F2} - h_1\sin(\varphi_{F2} - \varphi_{R2}) \end{pmatrix};$$

wherein, $\alpha_1, \alpha_2$ are respectively the easy axis directions of two magnetic resistance resistors; $h_{JFR}$ is the coupling field of the free layer and reference layer of any one magnetic resistance resistor; $h_{BR}=H_{BF}/H_{AF}$, $H_{BF}$ is the magnitude of the free layer internal bias magnetic field of the magnetic resistance resistor; $H_{AF}$ is the magnitude of the free layer anisotropic field; $\theta_{BF}$ is the direction of the free layer internal bias magnetic field. In this embodiment, the four magnetic resistance resistors are the same. Therefore, it is considered that they have the same intrinsic parameters. For calculation, the intrinsic parameters of any one magnetic resistance resistor may be used.

(5) The calculated magnetic field parameters are compared with the previous results, and whether they can meet the requirement on precision is determined. (In the embodiment, it is considered that the requirement on precision is met if the difference between two calculated magnetic field strength is less than 1E-4 and the difference between two calculated directions is less than 0.01°). If yes, the result will be output. Otherwise, according to the magnetic field calculation, the angles of the reference layer magnetizing direction, $\varphi_{R1}$ and $\varphi_{R2}$ are updated, corresponding to Process ④ as shown in FIG. 5, and Step (2) is returned for continuation of iteration.

wherein, the step for updating the angle of the reference layer magnetizing direction is as follows:

the quartic equation of one unknown $x_1^4-2h_{X1}x_1^3+(h_{x1}^2+h_{Y1}^2-1)x_1^2+2h_{X1}x_1-h_{x1}^2=0$, is solved, wherein, $h_{X1}$ and $h_{Y1}$ are respectively the magnetic fields of the external magnetic field in the easy axis and hard axis directions of the first magnetic resistance resistor. The results of both $h_{X3}=h_F \cos\theta$, $h_{X1}=h_F \sin\theta$; $x_1=\sin\varphi_{R1}°$ may be obtained according to Step 4.

The above quartic equation of one unknown has four solutions. When the tunneling magnetic resistance is under a stable and balance status, $\varphi_{R1}$ has only one solution. This solution depends on the following three conditions:

1) $x_1$ is a real number and $|x_1| \leq 1$;
2) $h_{Y1} \cos\varphi_{R1} + h_{X1} \sin\varphi_{R1} + \cos 2\varphi_{R1} \geq 0$;
3) All the angular energies between this solution and the initial position of the tunneling magnetic resistance must be less than the energy at the initial position.

The quartic equation of one unknown $x_2^4-2h_{X2}x_2^3+(h_{x2}^2+h_{Y2}^2-1)x_2^2+2h_{X2}x_2-h_{X2}^2=0$ is solved, wherein, $h_{x2}, h_{Y2}$ are respectively the magnetic fields of the external magnetic field in the easy axis and hard axis directions of the second magnetic resistance resistor. The results of both may be obtained according to Step 4. The first magnetic resistance resistor is orthogonal to the second one, so $h_{X3}=h_F \sin\theta$. $h_{Y2}=h_F \cos\theta$; $x_2=\sin\varphi_{R2}°$ Similarly, $\varphi_{R2}$ may be determined with reference to the screening process of $\varphi_{R1}$.

The obtained $\varphi$ values are considered as the new given reference layer magnetizing directions $\varphi_{R1}, \varphi_{R2}$.

In other embodiments, the following formula can be solved by the computer numerical method to obtain the angle of the reference layer magnetizing direction of the magnetic resistance resistor. That is to say, the angle that those skilled in the art consider possible can be substituted into the following formula for computation, and whether the result is approaching to 0 is determined. If yes, it is considered that the substituted angle is the solution of $\varphi$. $h_y \sin \varphi - h_x \cos \varphi + \sin \varphi \cos \varphi = 0$. $h_x$ and $h_y$ are respectively the magnetic fields of the external magnetic field in the easy axis and hard axis directions of the first magnetic resistance resistor. The above formula is a general expression for calculating the angle of the reference layer magnetizing direction of the tunneling magnetic resistance single-domain module. Given X=sin $\varphi$, the above formula may be evolved as:

$$x^4 - 2h_x x^3 + (h_x^2 + h_y^2 - 1)x^2 + 2h_x x - h_x^2 = 0.$$

This is also the formula of calculating the reference layer magnetizing direction in the previous embodiment. The computer numerical method has the problems of precision, time and global convergence. Therefore, the former embodiment is recommended to calculate the reference layer magnetizing direction of the magnetic resistance resistor.

Through the above-mentioned iteration, the reference layer magnetizing direction will gradually converge to the real direction and the calculated external magnetic field also converges to the real external magnetic field. The iterative method convergence depends on whether the calculation of the reference layer magnetizing direction converges.

After the iteration is proceeded repetitively for the set times, if the difference between the result obtained and that obtained previously is not less than the set value yet, it is considered that the calculation process dose not converge and the current external magnetic field is an extremely large magnetic field. The set times depend on different requirements on magnetic resistance resistor and calculated precision. In this embodiment, the iteration is set by 20 times.

The Measurement Step of an Extremely Large Magnetic Field

Figure 1:
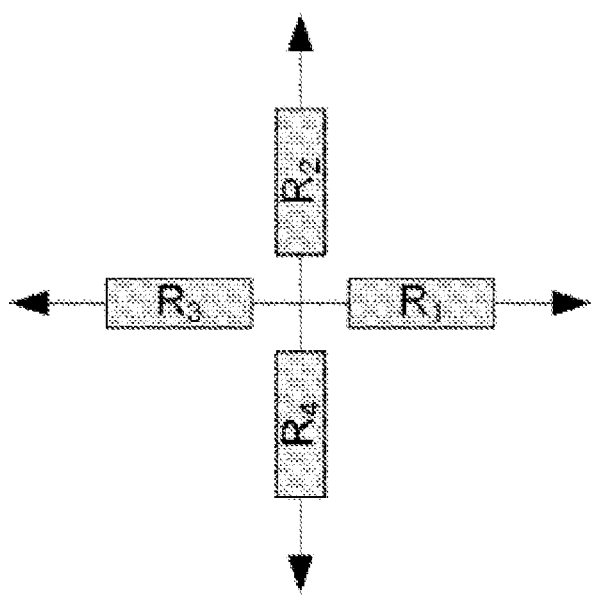
FIG. 1 shows the distribution diagram of the magnetic resistance resistors in an external magnetic field.
Figure 7:
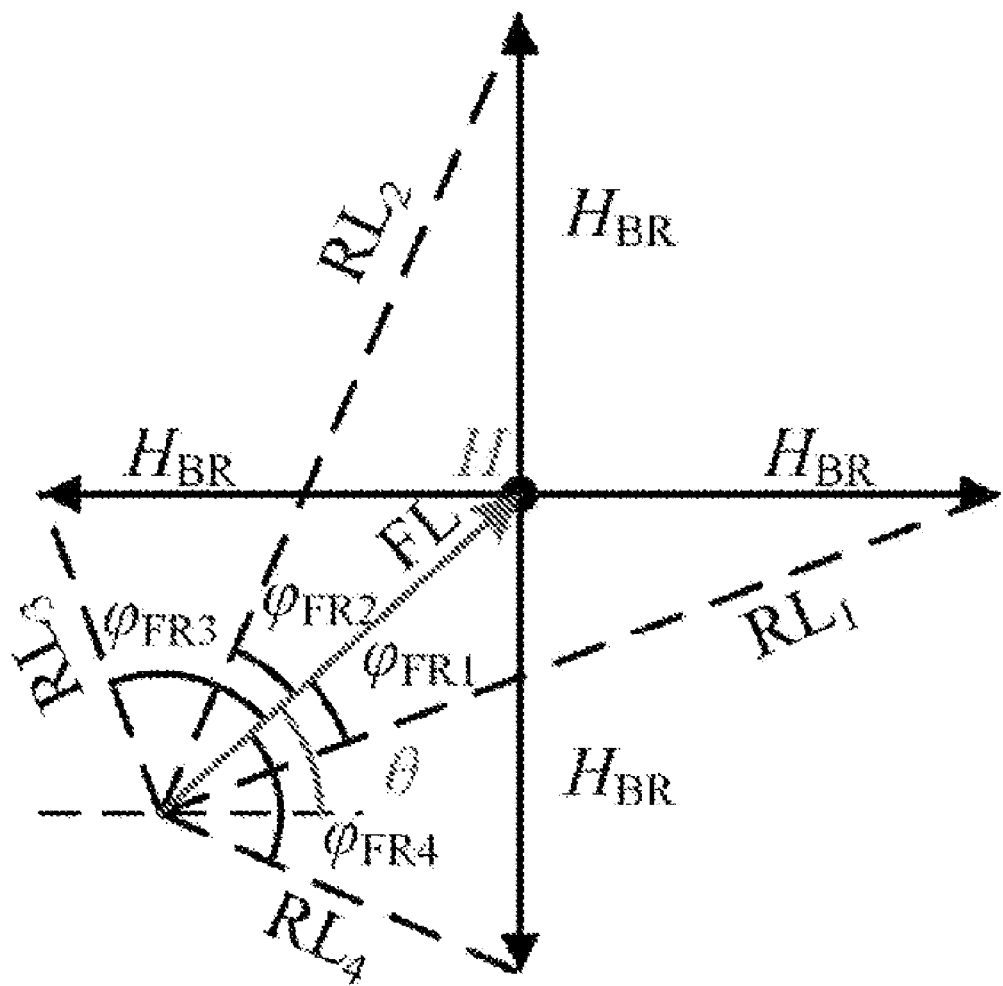
FIG. 7 is the vector diagram for the measurement of an extremely large magnetic field.

According to the arrangement of FIG. 1, the extremely large magnetic field distribution of the four magnetic resistance e resistors is shown in FIG. 7. With the resistor reference layer bias field direction as the reference direction, the four resistors are orthogonally arranged by 90° in turn, wherein, H is the amplitude of the external magnetic field; θ is the direction of the external magnetic field; FL is the resultant direction of the free layer magnetizing directions of the four resistors, which may be considered to be same as the external magnetic field direction; four vectors $H_{BR}$ represent the amplitudes and directions of the reference layer internal bias fields of the four magnetic resistance resistors. In this embodiment, the four magnetic resistance resistors are the same. Therefore, it is considered that they have the same amplitude of the reference layer internal bias field. The directions of the reference layer internal bias fields of two adjacent magnetic resistance resistors are orthogonal. $RL_{1,2,3,4}$ are the reference layer magnetizing directions of the four resistors, which are identical with the external magnetic field and the resultant direction of respective reference layer internal bias fields. $\varphi_{FR1,2,3,4}$ are the included angles between the free layer magnetizing directions and the reference layer magnetizing directions of the four resistors.

According to the vector relationship in FIG. 7, the relationship between the magnetizing directions of four chips and the external magnetic field is as follows:

$$\begin{cases} H\sin\varphi_{FR1} = H_{BR}\sin(\theta - \varphi_{FR1}) \\ H\sin\varphi_{FR2} = H_{BR}\cos(\theta + \varphi_{FR2}) \\ H\sin\varphi_{FR3} = H_{BR}\sin(\theta + \varphi_{FR3}) \\ H\sin\varphi_{FR4} = H_{BR}\cos(\theta - \varphi_{FR4}) \end{cases};$$

The amplitude and direction of the external magnetic field may be obtained by two of the above equations. However, it is unable to calculate the magnetic field of the complete two-dimensional plane with two resistors. If the external magnetic field is calculated by resistors R1 and R3, it will be clear that the external magnetic field is mirror-symmetrical at 0° to 180° and at 180° to 360°. Therefore, the direction range of the external magnetic field must be determined with the other two resistors then the calculation is performed with two proper resistors.

The resistors R1 and R3 are taken as one group, the following equation may be obtained:

$$\begin{cases} \theta_1 = \arctan\left(\dfrac{2\sin\varphi_{FR1}\sin\varphi_{FR3}}{\sin(\varphi_{FR3} - \varphi_{FR1})}\right) \\ H_1 = \dfrac{H_{BR}\sin(\varphi_{FR1} + \varphi_{FR3})}{\sqrt{\sin^2(\varphi_{FR1} - \varphi_{FR3}) + (2\sin\varphi_{FR1}\sin\varphi_{FR3})^2}} \end{cases};$$

wherein, $H_1$, $\theta_1$ are respectively the amplitude and direction of the external magnetic field obtained by $R_1$ and $R_3$.

The resistors R2 and R4 are taken as another group, the following equation may be obtained:

$$\begin{cases} \theta_2 = \arctan\left(\dfrac{2\sin\varphi_{FR2}\sin\varphi_{FR4}}{\sin(\varphi_{FR4} - \varphi_{FR2})}\right) \\ H_2 = \dfrac{H_{BR}\sin(\varphi_{FR2} + \varphi_{FR4})}{\sqrt{\sin^2(\varphi_{FR2} - \varphi_{FR4}) + (2\sin\varphi_{FR2}\sin\varphi_{FR4})^2}} \end{cases};$$

wherein, $H_2$, $\theta_2$ are respectively the amplitude and direction of the external magnetic field obtained by R2 and R4.

By comparing the angles of the above-mentioned two equations, the amplitude and direction of the external magnetic field may be obtained as follows:

$$H_0 = H_1 = H_2$$

$$\theta = \begin{cases} \theta_1, & \theta_1 \geq 0, \theta_2 \geq 0 \\ -\theta_1, & \theta_1 \geq 0, \theta_2 < 0 \\ \theta_1 + \pi, & \theta_1 < 0, \theta_2 \geq 0 \\ -\theta_1 - \pi, & \theta_1 < 0, \theta_2 < 0 \end{cases}.$$

In the formula, the calculation of the included angle between the free layer magnetizing direction and the reference layer magnetizing direction of each magnetic resistance resistor refers to Step (2) of the measurement step of a medium-and-large magnetic field.

After experiments, it is found that the magnetic field intensity of an extremely magnetic field obtained through procedures is different from the actual value and has basically a linear relation with the actual value. Therefore, it may be corrected.

The magnetic field direction obtained according to the above-mentioned calculation procedures is basically accurate. Therefore, it is sufficient only to correct the magnetic field amplitude. The amplitude is corrected according to: $H=kH_0+b$, $H_0$ is the magnetic field intensity of the external magnetic field obtained according to the above-mentioned calculation procedures; k and b are correction factors, which are dependent on the magnetic field angle measured; H is the optimized magnetic field amplitude. The relationship of the correction factors k and b and the magnetic field angle measured is as follows:

$$\begin{cases} k = 1.71 - 0.18|\cos 2\theta|, & 0 < \theta < \pi/2 \\ b = 0.19\theta - 0.94, & -0.1 < \theta < \pi/4 - 0.1 \end{cases};$$

The other angular ranges meet the cycle characteristics.

It should be noted that the correction factors k and b are varied with different magnetic resistance resistors. It is necessary to carry out testing calibration for a specific magnetic resistance resistor. Specifically, the $H_0$ obtained herein is compared with the real magnetic field (the result determined by an instrument with higher precision), and the numerical value relationship between $H_0$ and the real magnetic field is obtained in a way of numerical value fitting.

The present disclosure also provides a soft system corresponding to the above-mentioned method and steps.

The present disclosure is not limited to the aforesaid detailed description of the embodiments. The present disclosure is extended to any new characteristic or any new combination disclosed herein and to any new method or procedures of process or any new combination disclosed.

The invention claimed is:

1. A wide magnetic field range measuring method, comprising a measurement step for a small magnetic field, a measurement step for a medium-and-large magnetic field and a measurement step for an extremely large magnetic field, in addition to that, further comprising steps of:

Step 1: placing four orthogonally-configured magnetic resistance resistors into an external magnetic field and obtaining the resistance value of each magnetic resistance resistor, wherein the first magnetic resistance resistor and the third magnetic resistance resistor are placed on one straight line, the second magnetic resistance resistor and the fourth magnetic resistance resistor are placed on the other straight line, and the two straight lines are perpendicular to each other; and Step 2: if resistance value variation quantities of the detected four resistance values of the four magnetic resistance resistors are less than set values with respect to a zero magnetic field, measuring the external magnetic field by the measurement step for a small magnetic field; if all the detected four resistance values of the four magnetic resistance resistors are reduced, measuring the external magnetic field by the measurement step for an extremely large magnetic field;

if none of the four resistance values of the four magnetic resistance resistors can meet the two above-mentioned judging conditions, substituting the resistance values of two mutually orthogonal magnetic resistance resistors into the measurement step for a medium-and-large magnetic field for calculation; if the calculation process converges, then determining that the external magnetic field as a medium-and-large magnetic field with the calculation result representing the magnetic field intensity and direction of the medium-and-large magnetic field; and if the calculation process does not converge, then substituting the resistance values of the four magnetic resistance resistors in the measurement step for an extremely large magnetic field for calculation and determining that the external magnetic field is an extremely large magnetic field with the calculation result representing the magnetic field intensity and direction of the extremely large magnetic field;

wherein, the measurement step for a medium-and-large magnetic field further includes:

Step M1: obtaining the resistance values of two mutually orthogonal magnetic resistance resistors in the external magnetic field, and considering initial reference layer magnetizing directions of these two magnetic resistance resistors without a magnetic field as given reference layer magnetizing directions $\varphi_{R1}$, $\varphi_{R2}$;

Step M2: calculating included angles between free layer magnetizing directions and the reference layer magnetizing directions of the two magnetic resistance resistors according to the resistance values of the two magnetic resistance resistors;

Step M3: calculating the free layer magnetizing directions of the two magnetic resistance resistors according to the given reference layer magnetizing directions $\varphi_{R1}$, $\varphi_{R2}$ of the two magnetic resistance resistors and the included angles between the free layer magnetizing directions and the reference layer magnetizing directions of the two magnetic resistance resistors;

Step M4: obtaining the magnetic field amplitude and direction of the external magnetic field according to the given reference layer magnetizing directions of the two magnetic resistance resistors and the free layer magnetizing directions of the two magnetic resistance resistors; and Step M5: comparing the magnetic field amplitude and direction of the external magnetic field calculated for this time with a previously calculated result, if a difference of the two calculated results is greater than a set threshold, updating the reference layer magnetizing directions of the two magnetic resistance resistors according to the magnetic field amplitude and direction of the external magnetic field calculated for this time, and considering the updated reference layer magnetizing directions as new given reference layer magnetizing directions $\varphi_{R1}$, $\varphi_{R2}$, and executing the Steps M2 to M5 until the difference of the two calculated results is less than the set threshold;

the measurement step for an extremely large magnetic field further includes:

Step N1: calculating included angles between the free layer magnetizing directions and the reference layer magnetizing directions of the four magnetic resistance resistors according to the resistance values of the four magnetic resistance resistors;

Step N2: calculating the magnetic field intensity $H_1$ and direction $\theta_1$ of the external magnetic field according to the included angle between the free layer magnetizing direction and the reference layer magnetizing direction of the first magnetic resistance resistor and the included angle between the free layer magnetizing direction and the reference layer magnetizing direction of the third magnetic resistance resistor, and calculating the magnetic field intensity $H_2$ and direction $\theta_2$ of the external magnetic field according to the included angle between the free layer magnetizing direction and the reference layer magnetizing direction of the second magnetic resistance resistor and the included angle between the free layer magnetizing direction and the reference layer magnetizing direction of the fourth magnetic resistance resistor; and Step N3: determining the final magnetic field intensity $H_0$ of the external magnetic field according to the magnetic field intensities $H_1$ and $H_2$, and determining the final direction θ of the external magnetic field according to the directions $θ_2$ and $θ_1$.

2. The wide magnetic field range measuring method according to claim 1, wherein the measurement step for a small magnetic field further includes:

Step S1: acquiring the resistance values $R_1$ and $R_2$ of two mutually orthogonal magnetic resistance resistors in a magnetic field to be measured;

Step S2: substituting the resistance value $R_1$ of one magnetic resistance resistor and its intrinsic parameters into the formula $R=k_m \cos(θ-θ_0)H_0+R_0$, and substituting the resistance value $R_2$ of the other magnetic resistance resistor and its intrinsic parameters into the formula $R=k_m \cos(θ-θ_0-θ')H_0+R_0$ to obtain binary equations:

wherein, R is the resistance value of the magnetic resistance resistor placed into the magnetic field to be measured; $H_0$ is the magnetic field intensity of the magnetic field to be measured; θ is the direction of the magnetic field to be measured; and $R_0$ is the resistance value of the magnetic resistance resistor in case of a zero magnetic field;

$$k_m = \sin(\varphi_{F0} - \varphi_{R0})\sqrt{A^2 + B^2 - 2AB\cos(\varphi_{F0} - \varphi_{R0})};$$

$$θ_0 = \frac{\pi}{2} - \arctan\frac{B\sin\varphi_{R0} - A\sin\varphi_{F0}}{A\cos\varphi_{F0} - B\cos\varphi_{R0}};$$

wherein, $\varphi_{F0}$ is the free layer saturation-magnetization direction and $\varphi_{R0}$ is the reference layer saturation-magnetization direction, when the magnetic resistance resistor is placed in the zero magnetic field;

$$A = \frac{1}{H_{AF}} \frac{1}{h_{BF}\cos θ_{BF}\sec\varphi_{F0} + \cos^2\varphi_{F0}},$$

$$B = \frac{1}{H_{AR}} \frac{\sin(θ - \varphi_{R0})}{h_{BR}\cos θ_{BR}\sec\varphi_{R0} + \cos^2\varphi_{R0}};$$

wherein, $H_{AF}$ is the anisotropy field amplitude of the free layer of the magnetic resistance resistor and $H_{AR}$ is the anisotropy field amplitude of the reference layer of the magnetic resistance resistor;

$h_{BF}=H_{BF}/H_{AF}$, $H_{BF}$ and $θ_{BF}$ are respectively the amplitude and direction of the internal bias magnetic field of the free layer of the magnetic resistance resistor;

$h_{BR}=H_{BR}/H_{AR}$. $H_{BR}$ and $θ_{BR}$ are respectively the amplitude and direction of the internal bias magnetic field of the reference layer of the magnetic resistance resistor; and Step S3: solving the binary equations in Step 2 to obtain the magnetic field intensity $H_0$ and direction θ of the magnetic field to be measured.

3. The wide magnetic field range measuring method according to claim 1, wherein after the Steps M2 to M5 are executed repetitively for set times, if the difference between the result obtained for this time and that obtained previously is still not less than a set value, it is considered that the calculation process of the measurement step for a medium-and-large magnetic field dose not converge.

4. The wide magnetic field range measuring method according to claim 1, wherein the measurement step for an extremely large magnetic field further includes Step N4: optimizing the magnetic field intensity $H_0$ according to the direction θ.

5. A wide magnetic field range measuring device, comprising a small magnetic field measurement module, a medium-and-large magnetic field measurement module and an extremely large magnetic field measurement module, and further comprising:

a magnetic resistance resistor resistance value obtaining module, which is used to obtain the resistance values of four orthogonally-configured magnetic resistance resistors in an external magnetic field, wherein the first magnetic resistance resistor and the third magnetic resistance resistor are placed on one straight line, the second magnetic resistance resistor and the fourth magnetic resistance resistor are placed on the other straight line, and the two straight lines are perpendicular to each other;

a magnetic field calculating module, which is used to determine to execute: if resistance value variation quantities of the detected four resistance values of the four magnetic resistance resistors are less than set values with respect to a zero magnetic field, measuring the external magnetic field with the small magnetic field measurement module; if the detected four resistance values of the four magnetic resistance resistors are reduced, measuring the external magnetic field with the extremely large magnetic field measurement module;

if none of the four resistance values of the four magnetic resistance resistors can meet the two above-mentioned judging conditions, substituting the resistance values of two mutually orthogonal magnetic resistance resistors into the medium-and-large magnetic field measurement module for calculation; if the calculation process converges, then determining that the external magnetic field as a medium-and-large magnetic field with the calculation result representing the magnetic field intensity and direction of the medium-and-large magnetic field; and if the calculation process does not converge, then substituting the resistance values of the four magnetic resistance resistors in the extremely large magnetic field measurement module for calculation and determining that the external magnetic field is an extremely large magnetic field with the calculation result representing the magnetic field intensity and direction of the extremely large magnetic field;

wherein, the medium-and-large magnetic field measurement module further includes:

an initialization submodule, which is used to obtain the resistance values of two mutually orthogonal magnetic resistance resistors in the external magnetic field and consider the initial reference layer magnetizing directions of these two magnetic resistance resistors without a magnetic field as the given reference layer magnetizing directions $\varphi_{R1}$, $\varphi_{R2}$;

a calculation submodule of the included angle between the free layer and the reference layer, which is used to respectively calculate the included angles between the free layer magnetizing directions and the reference layer magnetizing directions of two magnetic resistance resistors according to the resistance values of the two magnetic resistance resistors;

a calculation submodule of the free layer magnetizing direction, which is used to respectively calculate the free layer magnetizing directions of two magnetic resistance resistors according to the given reference layer magnetizing directions $\varphi_{R1},\varphi_{R2}$ of two magnetic resistance resistors and the included angles between the free layer magnetizing directions and the reference layer magnetizing directions of two magnetic resistance resistors;

a calculation submodule of the external magnetic field, which is used to obtain the magnetic field amplitude and direction of the external magnetic field according to the given reference layer magnetizing directions of two magnetic resistance resistors and the free layer magnetizing directions of two magnetic resistance resistors; and a submodule of accuracy determination, which is used to compare the magnetic field amplitude and direction of the external magnetic field calculated for this time with a previously calculated result, if a difference of the two calculated results is greater than a set threshold, update the reference layer magnetizing directions of the two magnetic resistance resistors according to the magnetic field amplitude and direction of the external magnetic field calculated for this time, and consider the updated reference layer magnetizing directions as new given reference layer magnetizing directions $\varphi_{R1}$, $\varphi_{R2}$, and the calculation submodule of the included angle between the free layer and the reference layer, the calculation submodule of the free layer magnetizing direction, the calculation submodule of the external magnetic field, and the submodule of accuracy determination are executed again until the difference of the two calculated results is less than the set threshold;

the extremely large magnetic field measurement module further comprises:

a calculation submodule of the included angle between the free layer magnetizing direction and the reference layer magnetizing direction of the magnetic resistance resistor, which is used to calculate the included angle between the free layer magnetizing direction and the reference layer magnetizing direction of each magnetic resistance resistor according to the resistance values of the four magnetic resistance resistors;

a pre-calculation submodule of the magnetic field intensity and direction of the external magnetic field, which is used to calculate the magnetic field intensity $H_1$ and direction $\theta_1$ of the external magnetic field according to the included angle between the free layer magnetizing direction and the reference layer magnetizing direction of the first magnetic resistance resistor and the included angle between the free layer magnetizing direction and the reference layer magnetizing direction of the third magnetic resistance resistor, and calculate the magnetic field intensity $H_2$ and direction $\theta_2$ of the external magnetic field according to the included angle between the free layer magnetizing direction and the reference layer magnetizing direction of the second magnetic resistance resistor and the included angle between the free layer magnetizing direction and the reference layer magnetizing direction of the fourth magnetic resistance resistor; and a determination submodule of the magnetic field intensity and direction of the external magnetic field, which is used to determine the final magnetic field intensity $H_0$ of the external magnetic field according to the magnetic field intensities $H_1$ and $H_2$, and determine the final direction $\theta$ of the external magnetic field according to the directions $\theta_2$ and $\theta_1$.

6. The wide magnetic field range measuring device according to claim 5, wherein the small magnetic field measurement module further includes:

an acquisition submodule of the resistance value of the magnetic resistance resistor, which is used to acquire the resistance values $R_1$ and $R_2$ of two mutually orthogonal magnetic resistance resistors in a magnetic field to be measured;

an establishing submodule of equations of a small magnetic field, which is used to substitute the resistance value $R_1$ of one magnetic resistance resistor and its intrinsic parameters into the formula $R=k_m \cos(\theta-\theta_0) H_0+R_0$, and substitute the resistance value $R_2$ of the other magnetic resistance resistor and its intrinsic parameters into the formula $R=k_m \cos(\theta-\theta_0-\theta') H_0+R_0$; to obtain binary equations:

wherein, R is the resistance value of the magnetic resistance resistor placed into the magnetic field to be measured; $H_0$ is the magnetic field intensity of the magnetic field to be measured; $\theta$ is the direction of the magnetic field to be measured; and $R_0$ is the resistance value of the magnetic resistance resistor in case of a zero magnetic field;

$$k_m = \sin(\varphi_{F0} - \varphi_{R0})\sqrt{A^2 + B^2 - 2AB\cos(\varphi_{F0} - \varphi_{R0})};$$

$$\theta_0 = \frac{\pi}{2} - \arctan\frac{B\sin\varphi_{R0} - A\sin\varphi_{F0}}{A\cos\varphi_{F0} - B\cos\varphi_{R0}}$$

wherein, $\varphi_{F0}$ is the free layer saturation-magnetization direction and $\varphi_{R0}$ is the reference layer saturation-magnetization direction, when the magnetic resistance resistor is placed in the zero magnetic field;

$$A = \frac{1}{H_{AF}} \frac{1}{h_{BF}\cos\theta_{BF}\sec\varphi_{F0} + \cos^2\varphi_{F0}},$$

$$B = \frac{1}{H_{AR}} \frac{\sin(\theta - \varphi_{R0})}{h_{BR}\cos\theta_{BR}\sec\varphi_{R0} + \cos^2\varphi_{R0}}$$

wherein, $H_{AF}$ is the anisotropy field amplitude of the free layer of the magnetic resistance resistor and $H_{AR}$ is the anisotropy field amplitude of the reference layer of the magnetic resistance resistor;

$h_{BF}=H_{BR}/H_{AF}$, $H_{BF}$ and $\theta_{BF}$ are respectively the amplitude and direction of the internal bias magnetic field of the free layer of the magnetic resistance resistor;

$h_{BR}=H_{BR}/H_{AR}$, $H_{BR}$ and $\theta_{BR}$ are respectively the amplitude and direction of the internal bias magnetic field of the reference layer of the magnetic resistance resistor; and a solving submodule of measurement equations of a small magnetic field, which is used to solve the binary equations to obtain the magnetic field intensity $H_0$ and direction $\theta$ of the magnetic field to be measured.

7. The wide magnetic field range measuring device according to claim 5, wherein after the calculation submodule of the included angle between the free layer and the reference layer, the calculation submodule of the free layer magnetizing direction, the calculation submodule of the external magnetic field, and the submodule of accuracy determination are executed repetitively for set times, if a difference between the result obtained for this time and that obtained previously is still not less than a set value, it is considered that the calculation process of the medium-and-large magnetic field measurement module dose not converge.

8. The wide magnetic field range measuring device according to claim 5, wherein the extremely large magnetic field measurement module further includes an optimization submodule of magnetic field intensity, which is used to optimize the magnetic field intensity $H_0$ according to the direction $\theta$.

* * * * *